United States Patent
Zhang

(10) Patent No.: US 7,775,823 B2
(45) Date of Patent: Aug. 17, 2010

(54) SOCKET CONNECTOR HAVING LEADING-AND-POSITIONING ARRANGEMENT WITHIN A PASSAGEWAY AND METHOD FOR MATING WITH THE SAME

(75) Inventor: Jie-Feng Zhang, ShenZhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 85 days.

(21) Appl. No.: 12/283,858

(22) Filed: Sep. 15, 2008

(65) Prior Publication Data
US 2009/0075509 A1    Mar. 19, 2009

(30) Foreign Application Priority Data
Sep. 13, 2007    (CN) .......................... 2007 2 0046632

(51) Int. Cl.
*H01R 13/625* (2006.01)
(52) U.S. Cl. ...................................... 439/342
(58) Field of Classification Search ................. 439/259, 439/342, 374, 733.1
See application file for complete search history.

(56) References Cited

U.S. PATENT DOCUMENTS

2005/0095897 A1* 5/2005 Hsu ............................ 439/342
2005/0142920 A1* 6/2005 Hashimoto ................... 439/342

FOREIGN PATENT DOCUMENTS

TW        444944        7/2001

* cited by examiner

*Primary Examiner*—Tho D Ta
*Assistant Examiner*—Travis Chambers
(74) *Attorney, Agent, or Firm*—Andrew C. Cheng; Wei Te Chung; Ming Chieh Chang

(57) ABSTRACT

An electrical connector (100) includes an insulating base (10) defining therein a plurality of receiving units (11) each surrounded by sidewalls (13). A cover (20) is moveably disposed on the insulating base (10) and includes a plurality of apertures (21) each aligned with the receiving units (11). A driving mechanism (30) is disposed on the base to drive the cover (20) to move along the base (10). Each receiving unit (11) includes a leading-and-positioning arrangement (14) extending from an inner sidewall (13b) thereof, and dividing the receiving unit into a first space (110) and a second space (111). A plurality of terminals (40) is received in said receiving units (11), each comprises a contacting portion (42) projecting into the second space (111) of the receiving unit (11).

19 Claims, 9 Drawing Sheets

SOCKET CONNECTOR HAVING LEADING-AND-POSITIONING ARRANGEMENT WITHIN A PASSAGEWAY AND METHOD FOR MATING WITH THE SAME

BACKGROUND OF THE INVENTION

1. Field of the Invention

The present invention relates to a socket connector, and more particularly, to a socket connector having leading-and-positioning arrangement within the passageway facilitating easy and reliable interconnection between a pin leg from a CPU and a contact arranged within the passageway.

2. Description of the Prior Art

TW patent No. 444944 issued to Mchugh on Jul. 1, 2001, discloses a conventional socket connector as shown in FIG. 9. The connector has an insulating housing 12' with a plurality of terminals 218' mounted therein. The insulating housing 12' defines a plurality of receiving grooves 16' therein and each receiving groove 16' defines a pair of retaining passageways 26 at opposite sides thereof. Each terminal 218 comprises a mounting portion 222' retained in the passageway 26, a pair of connecting portions 232' extending from opposite edges of the mounting portion 222' and perpendicular to the mounting portion 222' and a pair of contacting arms 234' extending face-to-face from the connecting portions 232'. The connecting portions 232' and the contacting arms 234' are exposed in the receiving groove 16' and the contacting arms 234' define a space therebetween for holding a mating pin of a CPU.

When the mating pin is inserted into the receiving groove 16', the contacting arms 234 clip and electrically contact with the mating pin. However, the opposing contacting arms 234 may not provide a steadily connecting effect and the configuration of the terminals 218 are complex and not advantage for manufacturing. Hence, a new design which can solve the problem is required.

SUMMARY OF THE INVENTION

Accordingly, an object of the present invention is to provide an electrical connector with an easily interconnection between the connector and a mating pin.

In order to achieve the object set forth, an electrical connector includes an insulating base defining therein a plurality of receiving units each surrounded by sidewalls. A cover is moveably disposed on the insulating base and includes a plurality of apertures each aligned with the receiving units. A driving mechanism is disposed on the base to drive the cover to move along the base. Each receiving unit includes a leading-and-positioning arrangement extending from an inner sidewall thereof, and dividing the receiving unit into a first space and a second space. A plurality of terminals is received in said receiving units, each comprises a contacting portion projecting into the second space of the receiving unit.

Other objects, advantages and novel features of the invention will become more apparent from the following detailed description of the present embodiment when taken in conjunction with the accompanying drawings.

DETAILED DESCRIPTION OF THE INVENTION

Figure 1:
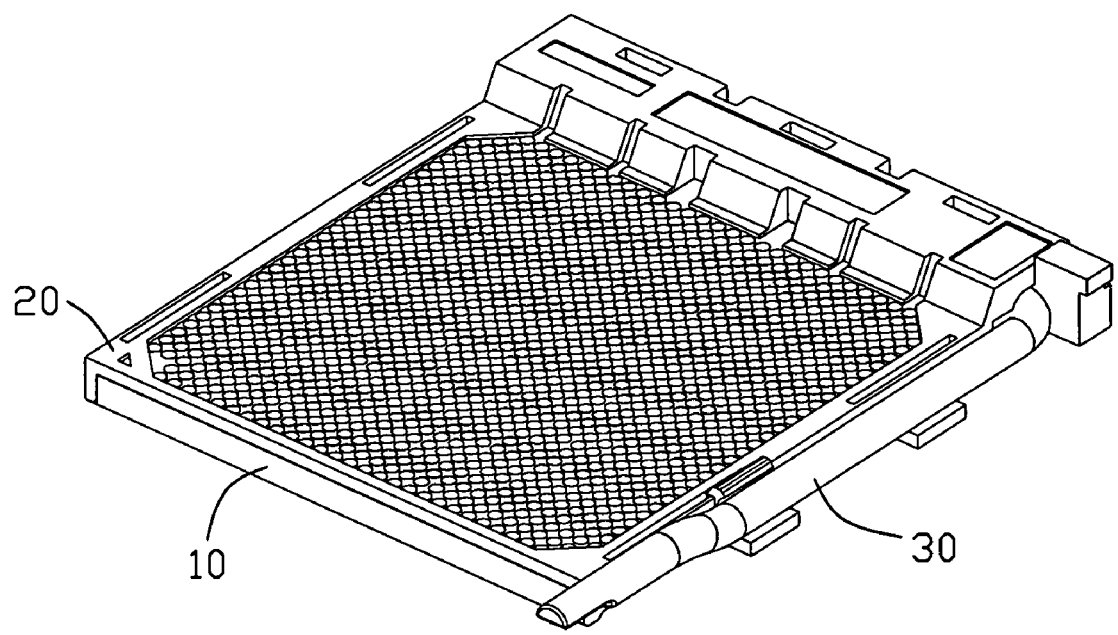
FIG. 1 is a perspective view of an electrical connector in accordance with the present invention.

Reference will now be made to the drawing figures to describe a preferred embodiment of the present invention in detail.

Figure 2:
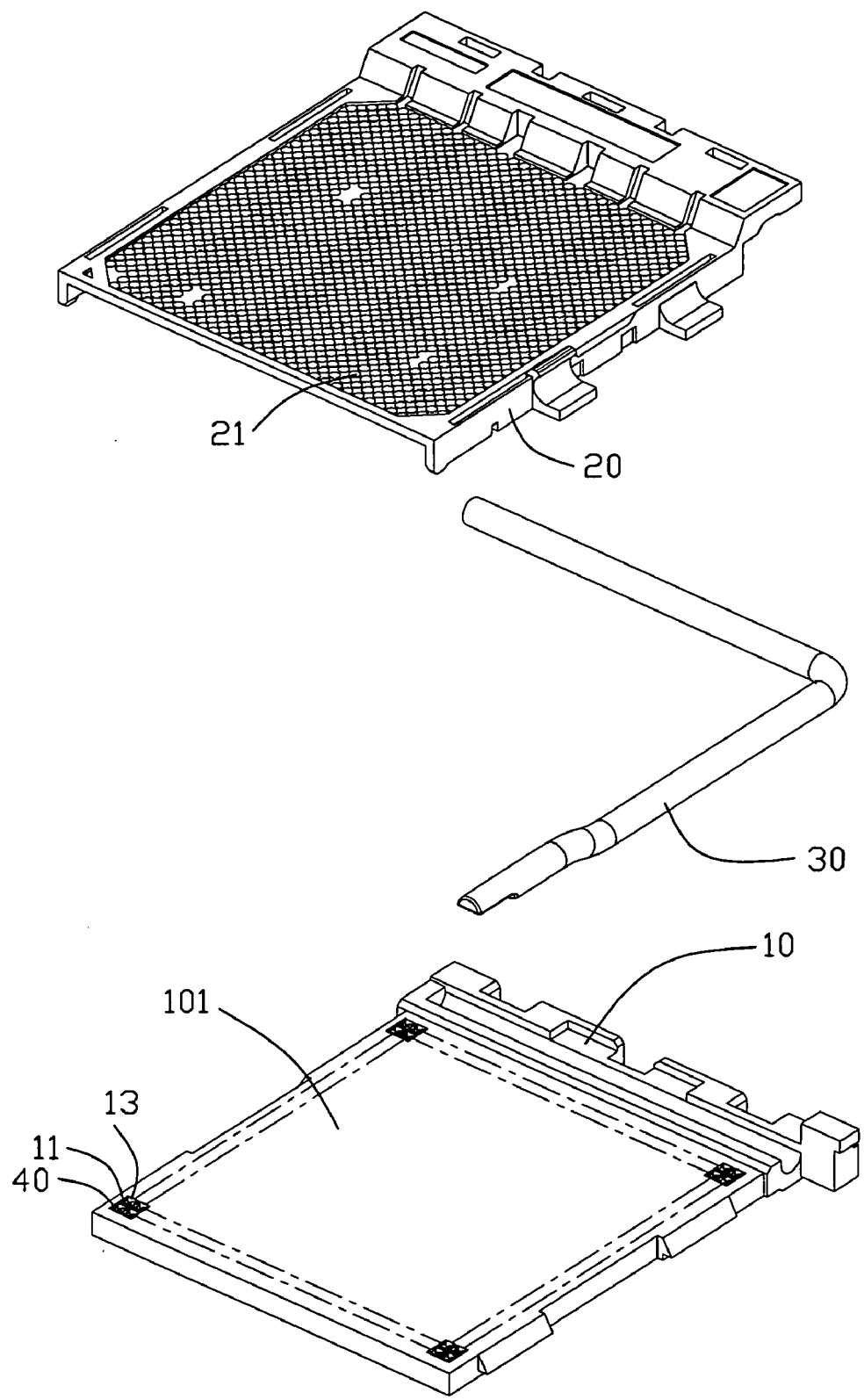
FIG. 2 is an exploded perspective view of the electrical connector shown in FIG. 1.
Figure 5:
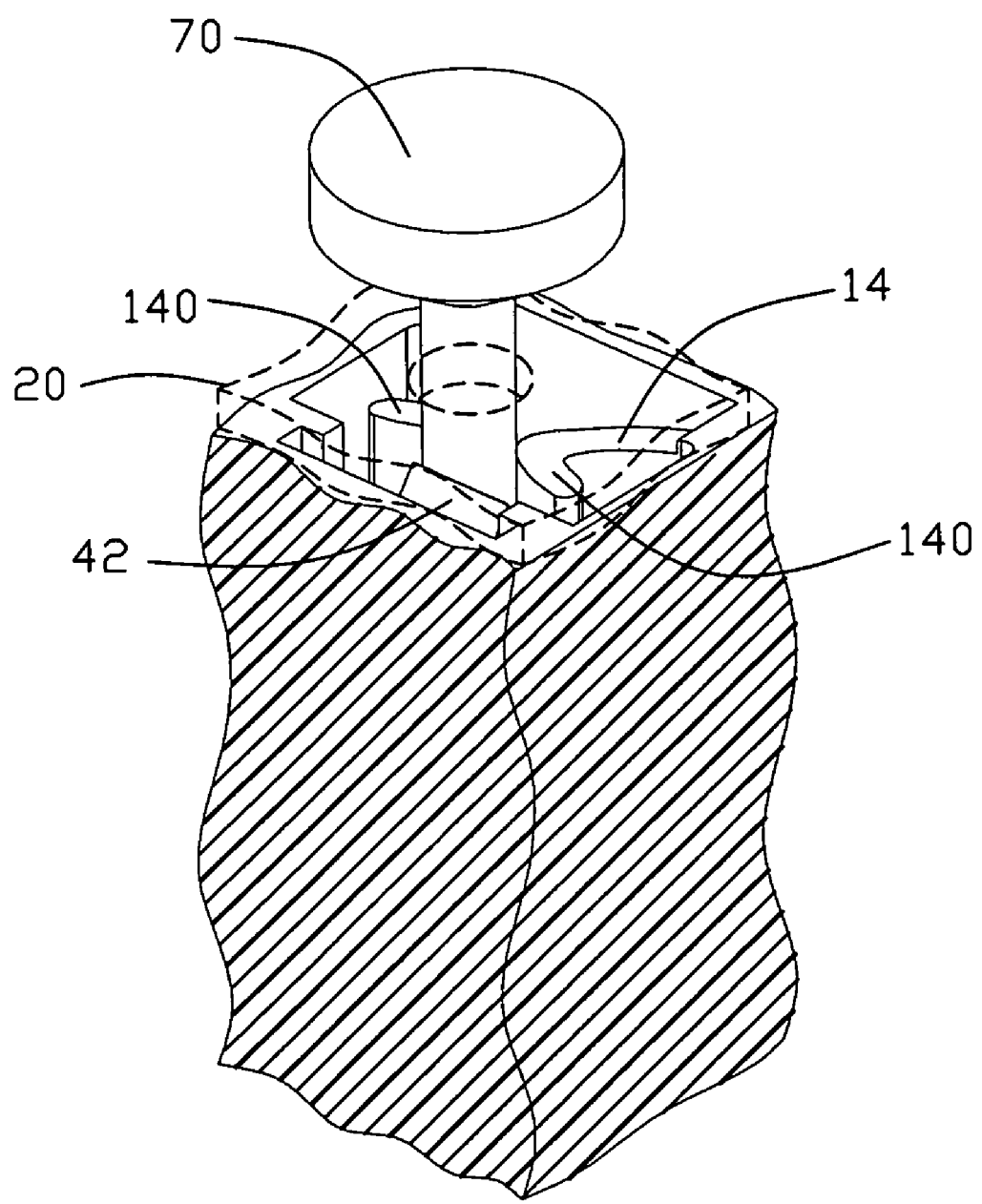
FIG. 5 is a perspective view of the receiving unit shown in FIG. 3, which is mated with a mating pin.

Referring to FIGS. 1 and 2, an electrical connector 100 in accordance with the present invention is provided and comprises an insulating base 10 mounting a plurality of terminals 40 thereon, a cover 20 movably assembled on the insulating base 10 and a level 30 actuating the cover 20 to slide on the insulating base 10. FIG. 5 shows engagement of the electrical connector 100 with a mating material 70, such as pins of an IC package in this embodiment.

Figure 3:
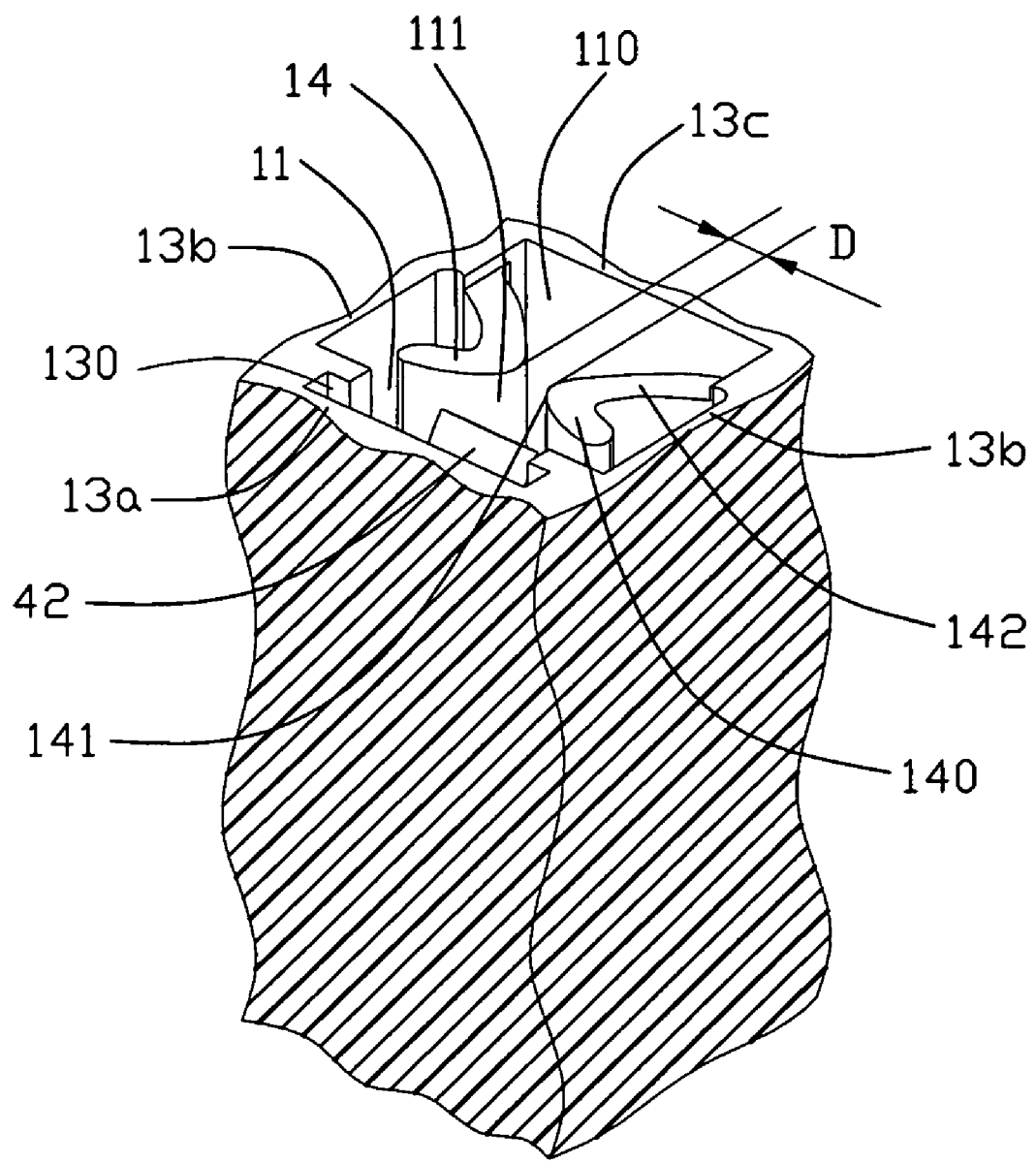
FIG. 3 is an amplified view of one receiving unit of the electrical connector.

Referring to FIGS. 2 and 3, the insulating base 10 is in a rectangular shape and defines a plurality of receiving passageways 11 therein running through in an up-to-down direction. Each receiving passageway 11 is enclosed by four side walls 13. For easily description, the receiving passageway 11 together with the side walls 13 is named as a receiving unit hereafter.

As shown in FIG. 3, the receiving unit defines a retaining groove 130 at one side wall 13a. The retaining groove 130 has an opening so as to communicate with the receiving unit 11. A pair of resilient arms 14 respectively extend from two opposite side walls 13b adjacent to the other side wall 13c opposite to the side wall 13a. The pair of resilient arms 14 oppositely project into the receiving unit 11 and obliquely extend toward the side wall 13a and outwards bent at a tip portion 141. The portion extending from the tip portion 141 of the resilient arm 14 is defined as a holding portion 140 which is adjacent to a free end, while another portion between the tip portion 141 and the sidewall 13b is defined as an extending portion 142. The resilient arms 14 are formed face-to-face, while the holding portions 140 extend reversely. The receiving unit is divided into a first space 110 and a second space 111, wherein the first space 110 is among the sidewall 13c and the extending portions 142 and the second space 111 is among the side wall 13a and the holding portions 140.

Figure 4:
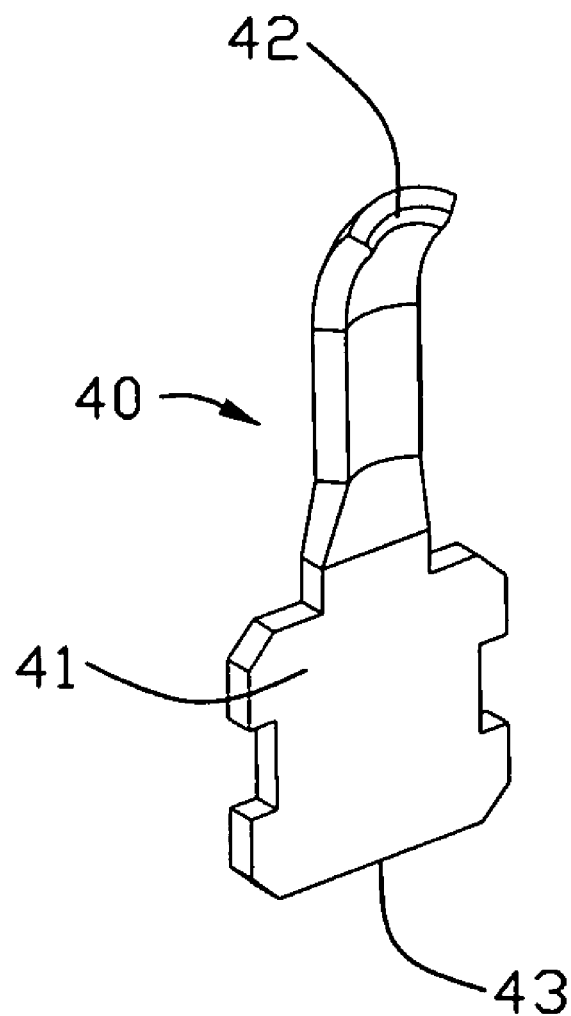
FIG. 4 is a perspective view of a terminal of the electrical connector.
Figure 6:
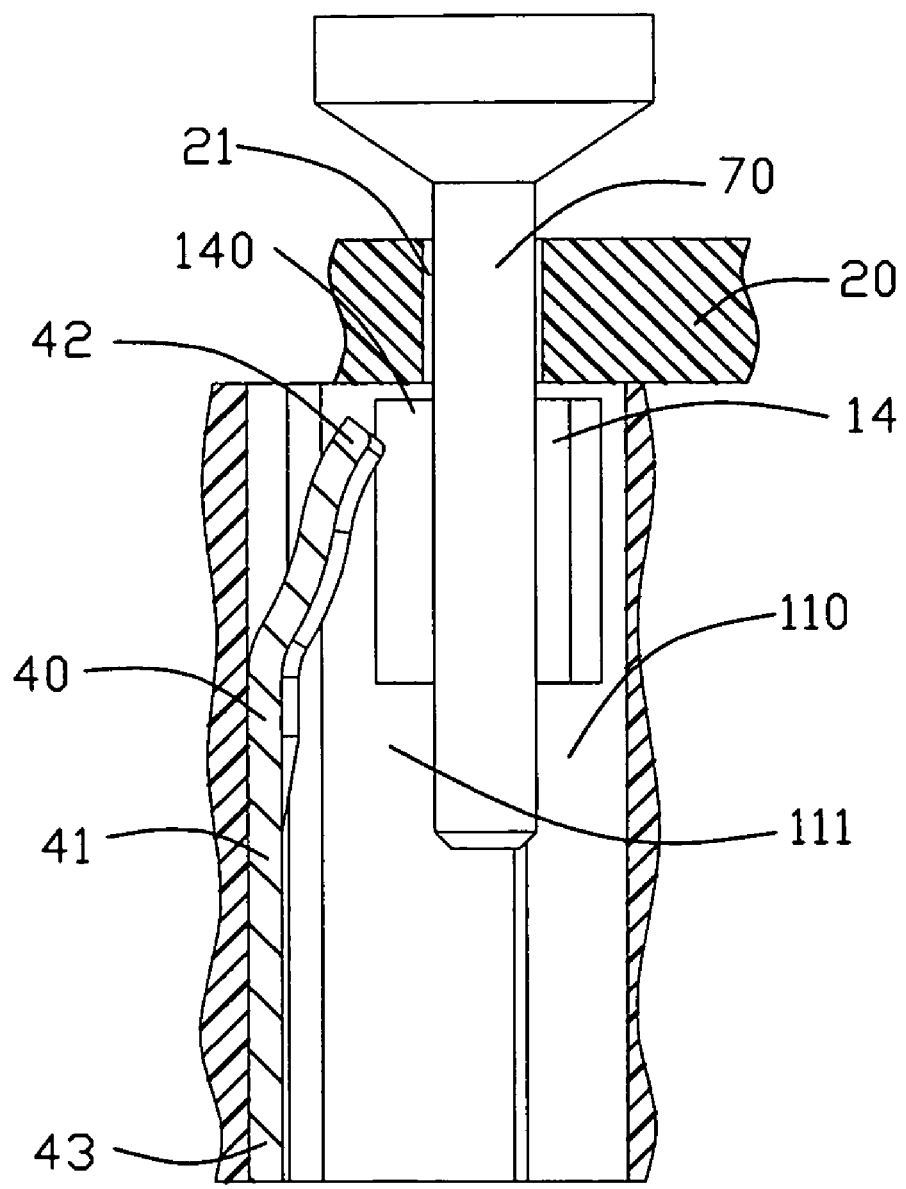
FIGS. 6 and 7 are cross sectional views of the receiving unit, which show mating process of the mating pin and the electrical connector.

As shown in FIGS. 4 and 6, the terminal 40 comprises a retaining portion 41 fixed in the retaining groove 130, a contacting portion extending from top end of the retaining portion 41 and projecting outwardly to expose in the second receiving space 111 and a solder portion formed by a bottom end of the retaining portion 41 to be soldered on a printed circuit board (PCB).

Figure 8A:
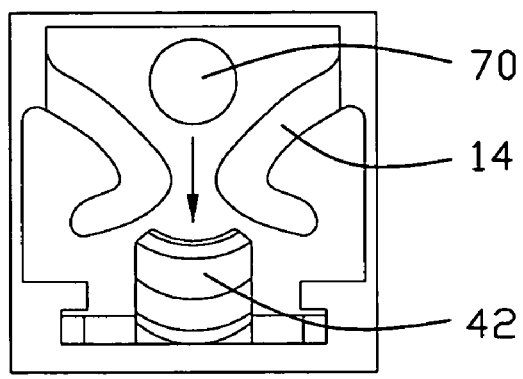
FIG. 8A to FIG. 8C are sketching views of mating process of the mating min and the electrical connector.
Figure 8B:
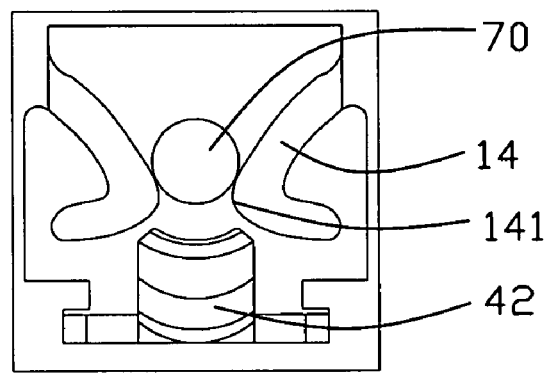
Figure 8C:
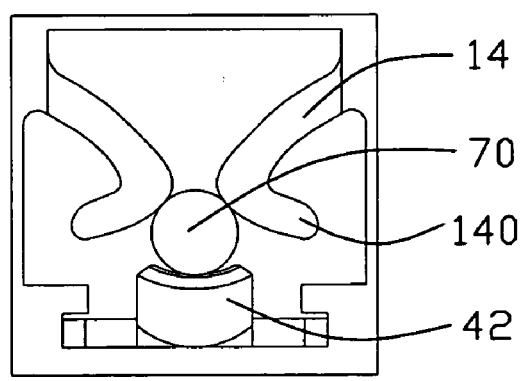
Figure 9:
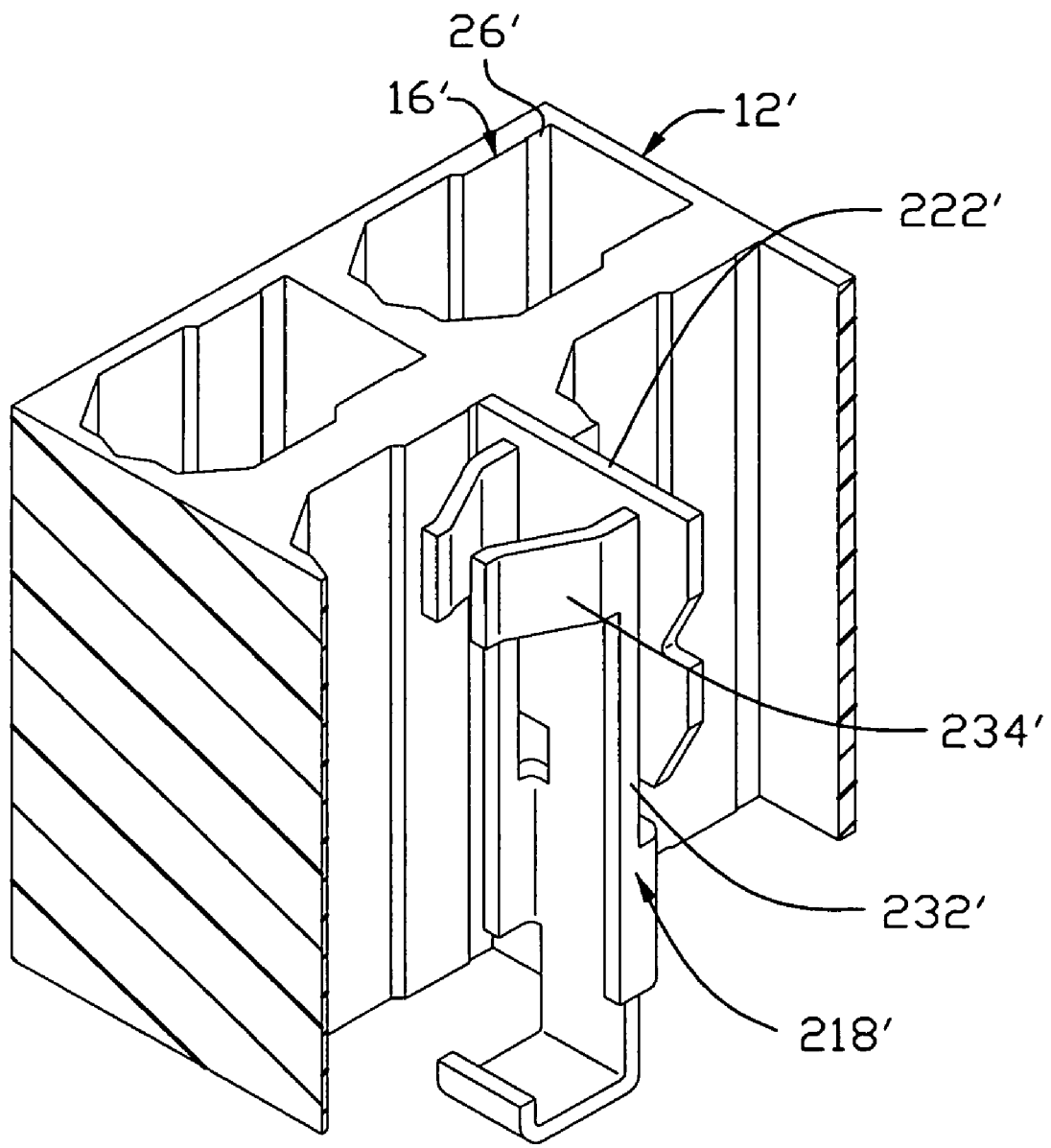
FIG. 9 is a partly amplified view of a conventional electrical connector.

As shown in FIG. 3, a passageway is defined between the tip portions 141 and the dimension D of the passageway is smaller than diameter (or width) of the mating pin 70. As shown in FIG. 8A to FIG. 8C, the mating pin 70 is firstly inserted into the first space 110 and then press the resilient arm 14 outward to enter into a second space 11 so that the pin is clipped by the contacting portion 42 and the holding portions 140. The contacting portion 42 has a steadily electrical connection with the mating pin 70 in help of the holding portions 140, therefore, the resilient arms 14 are named leading-and-positioning arrangements.

Figure 7:
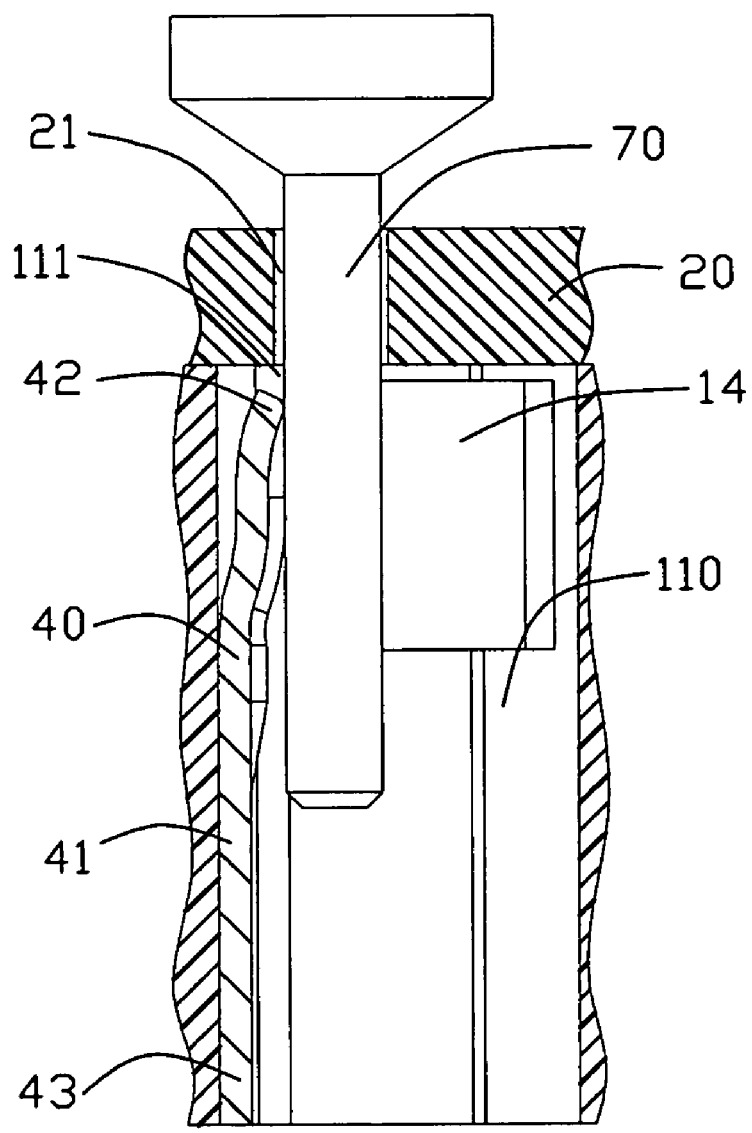

Referring to FIG. 2, the cover 20 defines a plurality of through holes 21 therein corresponding with the receiving units in the insulating base 10. The mating pins 70 are inserted in the first spaces 110 of the receiving units through the holes 21 of the cover. Then rotation of the level 30 drives the cover 20 to move on the insulating base 10, which brings the mating pins 70 passing the passageways of the resilient arms 14 and electrical connecting with the terminal 40, as shown in FIGS. 5 and 7.

In this embodiment, the structure of the terminal 40 is simple and easy for manufacturing, which is benefit for reducing the cost of the electrical connector. And more, the ingenious structure of the receiving unit provides a steadily electrical connection between the mating material 70 and terminal 40.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector comprising:
   an insulating base defining therein a plurality of receiving units each surrounded by sidewalls;
   a cover moveably disposed on the insulating base, and including a plurality of apertures each aligned with the receiving units;
   a driving mechanism disposed on the base to drive the cover to move along the base;
   each receiving unit including a leading-and-positioning arrangement dividing the receiving unit into a first space and a second space; and
   a plurality of terminals received in said receiving units, each comprising a contacting portion projecting into the second space of the receiving unit; wherein the leading-and-positioning arrangement monolithically extends from at least one inner sidewall of the receiving unit.

2. The electrical connector as claimed in claim 1, wherein said leading-and-positioning arrangement includes a pair of resilient arms extending from opposite side walls, and each resilient arm defines a tip portion facing to each other and nearer to each other than other portions of the resilient arms.

3. The electrical connector as claimed in claim 2, wherein each resilient arm has an extending portion extending from the side wall and a holding portion extending freely from the tip portion, the second space is among the holding portions and the contacting portion, while the first space is among the extending portions and a side wall.

4. The electrical connector as claimed in claim 3, wherein a retaining groove is defined in a side wall facing the holding portions, the terminal having a retaining portion secured in said retaining groove.

5. The electrical connector as claimed in claim 1, wherein said receiving unit is used with a corresponding pin of an electronic package, and said leading-and-positioning arrangement is essentially resilient so as to allow the corresponding pin to move between the first space and the second space.

6. The electrical connector as claimed in claim 5, wherein said corresponding pin is essentially under a free status in the first space while being under a tensioned status in the second space because of being simultaneously engaged with the leading-and-positioning arrangement and the contacting portion.

7. The electrical connector as claimed in claim 6, wherein the leading-and-positioning arrangement monolithically extends from at least one inner sidewall of the receiving unit.

8. The electrical connector as claimed in claim 5, wherein the leading-and-positioning arrangement monolithically extends from at least one inner sidewall of the receiving unit.

9. The electrical connector as claimed in claim 8, wherein said contacting portion imposes a force upon the corresponding pin in a direction parallel to a movement direction of the corresponding pin between the first space and the second space.

10. The electrical connector as claimed in claim 8, wherein said leading-and-positioning arrangement includes a resilient arm which is deflected to move in a lateral direction perpendicular to a movement direction of the corresponding pin between the first space and the second space under a condition that said resilient arm is not deflected in said lateral direction when said corresponding pin is located in either the first space or the second space.

11. The electrical connector as claimed in claim 10, wherein said contacting portion imposes a force upon the corresponding pin in an engagement direction parallel to the movement direction of the corresponding pin, under a condition that said contacting portion cooperates with the resilient arm to sandwich the corresponding pin therebetween in said engagement direction.

12. An electrical connector adapted for engagement with a mating material, comprising:
   an insulating base defining a plurality of receiving passageways therein;
   a cover moveably disposed on the insulating base and including a plurality of apertures each aligned with the receiving passageways;
   a driving mechanism disposed on the base to drive the cover to move along the base;
   a pair of resilient arms monolithically extending from the insulating base and exposing to the receiving passageway;
   a plurality of terminals received in the receiving passageways, each comprising a retaining portion secured in the base and a contacting portion extending from the retaining portion and projecting to the receiving passageway; and
   each resilient arm defining a holding portion so that the mating material is clipped by the contacting portion and the holding portions in a triangular form.

13. The electrical connector as claimed in claim 12, wherein each resilient arm defines a tip portion nearer to each other than other portions of the resilient arm, an extending portion and the holding portion are respectively formed at opposite ends of the tip portion.

14. The electrical connector as claimed in claim 13, wherein the receiving passageway is divided into a first space and a second space by the tip portions, the second space is among the holding portions and the contacting portion.

15. The electrical connector as claimed in claim 13, wherein a passageway is defined between the tip portions, the dimension of the passageway is smaller than that of the mating material.

16. The electrical connector as claimed in claim 15, wherein the contacting portion of the terminal electrically contacts with the mating material after the mating material passes the passageway.

17. A method of mating an electrical connector with a mating material, comprising the steps of:

providing an electrical connector comprising: an insulating base defining therein a plurality of receiving passageways surrounded by side walls, at least one leading-and-positioning arrangement extending from one of said side walls and dividing each of said receiving passageway into a first space and a second space, the at least one leading-and-positioning arrangement having a tip portion; a plurality of terminals received in said receiving passageways and each comprising a contacting portion projecting to the second space; a cover assembled on the insulating base and including a plurality of apertures each aligned with the receiving passageways; and a lever disposed on the base to drive the cover to move along the base;

inserting the mating material into the first space of the receiving passageway through the aperture; and actuating the lever to push the mating material to pass the tip portion and enter into the second space to electrically contact with the contacting portion of the terminal.

18. The method as claimed in claim 17, wherein the leading-and-positioning arrangement has a holding portion adjacent to the tip portion and facing the contacting portion of the terminal, the holding portion and the contacting portion clip the mating material after the mating material enters into the second space.

19. The method as claimed in claim 18, wherein the leading-and-positioning arrangement is a pair of resilient arms extending form opposite inner side walls and a passageway is defined between the tip portions, the resilient arms deflect outwardly when the mating material passes the passageway.

* * * * *